United States Patent
Lee et al.

(10) Patent No.: US 9,728,586 B2
(45) Date of Patent: Aug. 8, 2017

(54) ORGANIC PHOTOELECTRONIC DEVICE AND IMAGE SENSOR

(71) Applicant: Samsung Electronics Co., Ltd., Suwon-Si, Gyeonggi-Do (KR)

(72) Inventors: Gae Hwang Lee, Seongnam-si (KR); Kyung Bae Park, Hwaseong-si (KR); Sung Young Yun, Suwon-si (KR); Yong Wan Jin, Seoul (KR); Moon Gyu Han, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 100 days.

(21) Appl. No.: 14/589,612

(22) Filed: Jan. 5, 2015

(65) Prior Publication Data

US 2016/0020257 A1  Jan. 21, 2016

(30) Foreign Application Priority Data

Jul. 17, 2014 (KR) ........................ 10-2014-0090542

(51) Int. Cl.
*H01L 27/30* (2006.01)
*H01L 51/44* (2006.01)
*H01L 51/00* (2006.01)

(52) U.S. Cl.
CPC .......... *H01L 27/307* (2013.01); *H01L 51/441* (2013.01); *H01L 51/008* (2013.01); *H01L 51/0078* (2013.01); *H01L 2251/308* (2013.01); *Y02E 10/549* (2013.01)

(58) Field of Classification Search
CPC ................. H01L 27/307; H01L 51/441; H01L 2251/308; H01L 51/008; H01L 51/0078; Y02E 10/549
See application file for complete search history.

(56) References Cited

U.S. PATENT DOCUMENTS

| 7,732,805 | B2 | 6/2010 | Shim |
| 7,932,574 | B2 | 4/2011 | Kanbe |
| 2012/0249829 | A1 | 10/2012 | Izuha et al. |
| 2016/0013247 | A1* | 1/2016 | Nakatani ............... H01L 27/307 257/40 |

FOREIGN PATENT DOCUMENTS

| JP | 4075678 B2 | 4/2008 |
| JP | 4982426 B2 | 7/2012 |
| KR | 100685796 B1 | 2/2007 |

OTHER PUBLICATIONS

S. Nam, "Two-dimensional photonic crystal arrays for polymer:fullerene solar cells", IOP Publishing Ltd., Nanotechnology 22, 2011, 7pgs, 0957-4484/11/465403+06, Republic of Korea.

* cited by examiner

*Primary Examiner* — John P Dulka
(74) *Attorney, Agent, or Firm* — Harness, Dickey & Pierce, P.L.C.

(57) ABSTRACT

An organic photoelectronic device includes a first electrode having a plurality of nanopatterns arranged at a regular interval, a second electrode facing the first electrode and an active layer between the first electrode and the second electrode, the active layer absorbing light in at least one wavelength of a visible ray region.

16 Claims, 13 Drawing Sheets

ORGANIC PHOTOELECTRONIC DEVICE AND IMAGE SENSOR

CROSS REFERENCE TO RELATED APPLICATION

This application claims priority to and the benefit of Korean Patent Application No. 10-2014-0090542 filed in the Korean Intellectual Property Office on Jul. 17, 2014, the entire contents of which are incorporated herein by reference.

BACKGROUND

1. Field

Example embodiments provide an organic photoelectronic device and an image sensor.

2. Description of the Related Art

A photoelectronic device converts light into an electrical signal using photoelectronic effects. The photoelectronic device may include a photodiode and/or a phototransistor, and may be applied to an image sensor and/or a solar cell.

An image sensor including a photodiode requires relatively high resolution and thus a relatively small pixel. At present, a silicon photodiode is widely used, but has deteriorated sensitivity since the silicon photodiode has a relatively small absorption area due to relatively small pixels. Accordingly, an organic material that is capable of replacing silicon has been researched.

The organic material has a relatively high extinction coefficient and selectively absorbs light in a particular wavelength region depending on a molecular structure, and thus may simultaneously replace a photodiode and a color filter and resultantly improve sensitivity and contribute to relatively high integration.

SUMMARY

Example embodiments provide an organic photoelectronic device being capable of improving efficiency by increasing light absorbance of an active layer including an organic material.

Example embodiments also provide an image sensor including the organic photoelectronic device. Example embodiments also provide an electronic device including the image sensor.

According to example embodiments, an organic photoelectronic device includes a first electrode and a second electrode facing each other, the first electrode including a plurality of nanopatterns arranged at a regular interval, and an active layer between the first electrode and the second electrode, the active layer absorbing light in at least one wavelength region of a visible ray region.

The first electrode may have one of a plurality of holes arranged at a regular interval and protrusions and depressions arranged at a regular interval.

The first electrode may have a first side contacting the active layer and a second side facing the first side, and the protrusions and depressions may be on the second side.

The first electrode may selectively reflect light to the active layer in a wavelength region absorbed by the active layer.

The first electrode may selectively reflect light to the active layer in one of a blue wavelength region, a red wavelength region, and a green wavelength region.

The blue wavelength region may have a maximum absorption wavelength ($\lambda_{max}$) at greater than or equal to about 400 nm and less than about 500 nm, the red wavelength region may have a maximum absorption wavelength ($\lambda_{max}$) at greater than about 580 nm and less than or equal to about 700 nm, and the green wavelength region may have a maximum absorption wavelength ($\lambda_{max}$) at about 500 nm to about 580 nm.

The first electrode may have may simultaneously satisfy the following Relationship Equations 1 and 2.

$$\lambda_{max} > d \quad \text{[Relationship Equation 1]}$$

$$\lambda_{max} > P \quad \text{[Relationship Equation 2]}$$

In the Relationship Equations 1 and 2,
$\lambda_{max}$ is a maximum absorption wavelength of a wavelength region to be reflected,
d is a diameter of nanopatterns, and
P is an interval between adjacent nanopatterns.

According to example embodiments, an image sensor includes a semiconductor substrate integrated with a first photoelectronic device sensing light in a first wavelength region and a second photoelectronic device sensing light in a second wavelength region, and an organic photoelectronic device on the semiconductor substrate and selectively absorbing light in a third wavelength region, the organic photoelectronic device including a first electrode and a second electrode facing each other, the first electrode including a plurality of nanopatterns arranged at a regular interval, and an active layer between the first electrode and the second electrode and selectively absorbing light in a third wavelength region.

The first electrode may have one of a plurality of holes arranged at a regular interval and protrusions and depressions arranged at a regular interval.

The first electrode may have a first side contacting the active layer and a second side facing the first side, and the protrusions and depressions may be on the second side.

The first electrode may selectively reflect light to the active layer in the third wavelength region.

The first electrode may simultaneously satisfy the following Relationship Equations 1 and 2.

$$\lambda_{max} > d \quad \text{[Relationship Equation 1]}$$

$$\lambda_{max} > P \quad \text{[Relationship Equation 2]}$$

In the Relationship Equations 1 and 2,
$\lambda_{max}$ is a maximum absorption wavelength of the third wavelength region,
d is a diameter of nanopatterns, and
P is an interval between adjacent nanopatterns.

The image sensor may further include an insulation layer between the semiconductor substrate and the organic photoelectronic device, the insulation layer in contact with the first electrode, wherein the refractive index of the insulation layer is smaller than that of the first electrode.

The first electrode and the insulation layer may have a refractive index difference of greater than or equal to about 0.05.

The image sensor may further include a color filter layer on one side of the semiconductor substrate and including a first color filter selectively absorbing light in the first wavelength region and a second color filter selectively absorbing light in the second wavelength region.

The first wavelength region may be a blue wavelength region, the second wavelength region may be a red wavelength region, and the third wavelength region may be a green wavelength region.

According to example embodiments, an electronic device includes the image sensor.

DETAILED DESCRIPTION

Figure 1:
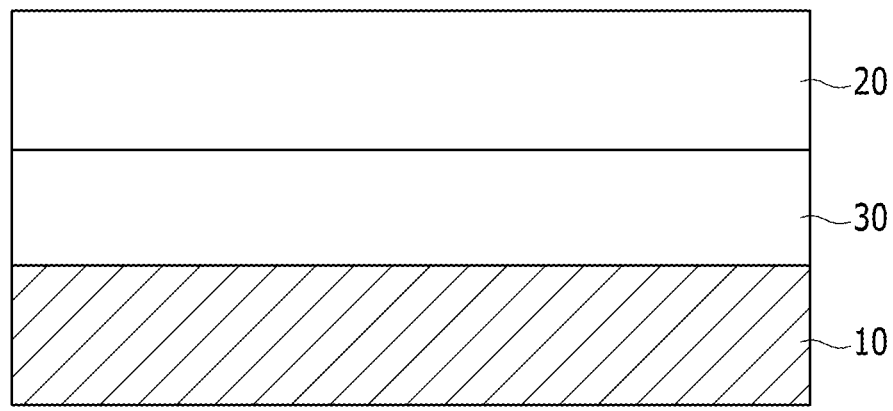
FIG. 1 is a cross-sectional view showing an organic photoelectronic device according to example embodiments, FIG. 2 (A) is a top plan view showing one example of a first electrode in an organic photoelectronic device according to example embodiments, FIG. 2 (B) is a cross-sectional view taken along a II-II line of FIG. 2 (A), FIG. 3 (A) is a top plan view showing one example of a first electrode in an organic photoelectronic device according to example embodiments, FIG. 3 (B) is a cross-sectional view taken along a III-III line of FIG. 3 (A)

Example embodiments will hereinafter be described in detail, and may be more easily performed by those who have common knowledge in the related art. However, this disclosure may be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first", "second", etc. may be used herein to describe various elements, components, regions, layers and/or sections, these elements, components, regions, layers and/or sections are not to be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments are not to be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, is to be interpreted as having a meaning that is consistent with their meaning in the context of the relevant art and will not be interpreted in an idealized or overly formal sense unless expressly so defined herein.

Hereinafter, referring to drawings, an organic photoelectronic device according to example embodiments is described.

FIG. 1 is a cross-sectional view showing an organic photoelectronic device according to example embodiments.

Referring to FIG. 1, an organic photoelectronic device 100 according to example embodiments includes a first electrode 10, a second electrode 20, and an active layer 30 interposed between the first electrode 10 and the second electrode 20.

The active layer 30 is a layer that absorbs light in at least one wavelength of a visible ray region, and may include, for example, an organic material absorbing at least one light in a red wavelength region, a blue wavelength region, and a green wavelength region. For example, the active layer 30 may include an organic material absorbing one of a red wavelength region, a blue wavelength region, and a green wavelength region. The active layer 30 may include a first p-type semiconductor and a first n-type semiconductor to form a heterojunction (bulk heterojunction), and absorbs light externally to generate excitons and then separates the generated excitons into holes and electrons.

One of the first electrode 10 and the second electrode 20 is an anode and the other is a cathode. At least one of the first electrode 10 and the second electrode 20 may be a light-transmitting electrode, and the light-transmitting electrode may be made of, for example, a transparent conductor, e.g., indium tin oxide (ITO) or indium zinc oxide (IZO), or a metal thin layer of a thin monolayer or multilayer. When one of the first electrode 10 and the second electrode 20 is a non-light-transmitting electrode, the first electrode 10 or the second electrode 20 may be made of, for example, an opaque conductor, e.g., aluminum (Al).

For example, the first electrode 10 may be a light-transmitting electrode. For example, the first electrode 10 and the second electrode 20 may be light-transmitting electrodes. For example, the first electrode 10 and the second electrode 20 are light-transmitting electrodes and the second electrode 20 may be an incident light electrode.

The first electrode 10 may have a plurality of nanopatterns arranged at a regular interval. The nanopatterns may be holes, recess portions, protruding portions, protrusions and depressions, or combinations thereof that have sizes of several nanometers to hundreds of nanometers, and their shapes are not particularly limited.

The first electrode 10 may have a first side contacting the active layer 30 and a second side facing the first side. When the nanopatterns are holes, the holes may be formed to penetrate the first electrode from the first side to the second side. When the nanopatterns are protrusions and depressions or combination thereof, the protrusions and depressions may be formed on the second side.

The plurality of nanopatterns are regularly arranged at predetermined or given intervals and with a predetermined or given size, and thus selectively reflect light in a predetermined or given wavelength region of the incident light to the active layer 30 and transmit light in the remaining wavelength regions. Therefore, light to be selectively reflected may be absorbed by the active layer 30 again to increase absorbance of the active layer 30.

The light to be selectively reflected may be, for example, one of a blue wavelength region, a red wavelength region, and a green wavelength region, wherein the blue wavelength region may be, for example, a maximum absorption wavelength ($\lambda_{max}$) at greater than or equal to about 400 nm and less than about 500 nm, the red wavelength region may be, for example, a maximum absorption wavelength ($\lambda_{max}$) at greater than about 580 nm and less than or equal to about 700 nm, and the green wavelength region may be, for example, a maximum absorption wavelength ($\lambda_{max}$) at about 500 nm to about 580 nm.

Hereinafter, referring to FIG. 2, an example of the first electrode 10 is described.

Figure 2A:
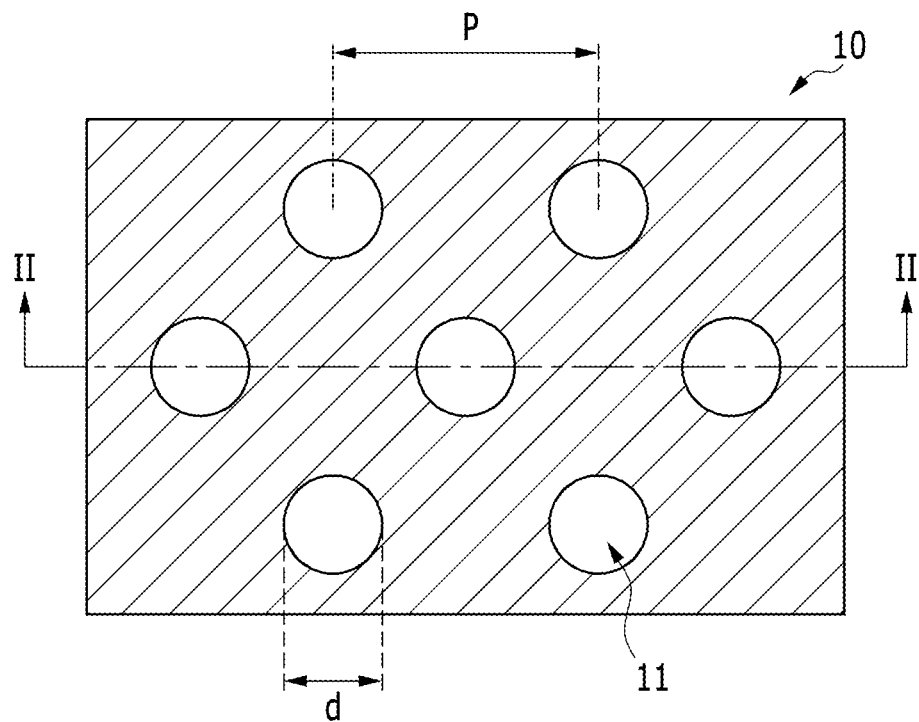
Figure 2B:
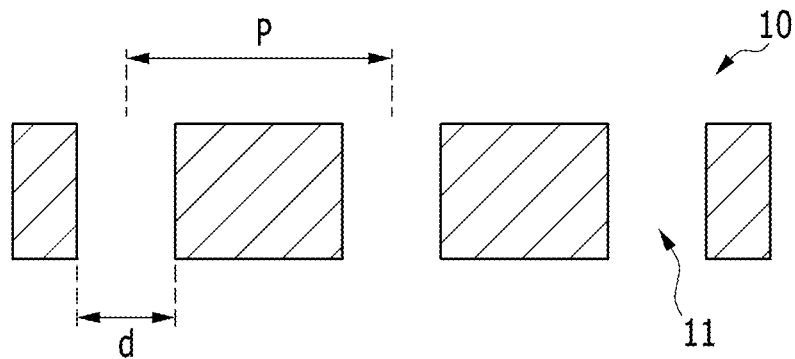

FIG. 2 (A) is a top plan view showing one example of a first electrode in an organic photoelectronic device according to example embodiments, and FIG. 2 (B) is a cross-sectional view taken along a II-II line of FIG. 2 (A).

Referring to FIGS. 2 (A) and (B), the first electrode 10 may have a plurality of holes 11 that penetrate the first electrode 10 from one side of the first electrode 10 to the other side. Each hole 11 has a predetermined or given size, and may have various shapes, e.g., a circle, a quadrangle, and/or a hexagon. A plurality of holes 11 may be regularly arranged in a row, column, and/or diagonal direction with a uniform interval.

The holes 11 may be formed regularly with a predetermined or given interval (P) and a predetermined or given size (d), and thus selectively reflect light in a predetermined or given wavelength region of the incident light to the active layer 30 and transmit light in the remaining wavelength regions. Herein, the wavelength region to be reflected may be the same as the wavelength region that the active layer 30 mainly absorbs, and for example, when the active layer 30 absorbs light in a blue wavelength region, the first electrode 10 may reflect light in a blue wavelength region to the active layer 30, when the active layer 30 absorbs light in a red wavelength region, the first electrode 10 may reflect light in a red wavelength region to the active layer 30, and when the active layer 30 absorbs light in a green wavelength region, the first electrode 10 may reflect light in a green wavelength region to the active layer 30.

The wavelength region to be reflected may be controlled by sizes (d) of the holes 11 and intervals (P) between adjacent holes 11. For example, the first electrode 10 may have may simultaneously satisfy the following Relationship Equations 1 and 2.

$\lambda_{max} > d$      [Relationship Equation 1]

$\lambda_{max} > P$      [Relationship Equation 2]

In the Relationship Equations 1 and 2, $\lambda_{max}$ is a maximum absorption wavelength of a wavelength region to be reflected, d is a diameter of nanopatterns, that is, holes, and P is an interval between adjacent nanopatterns, that is, an interval between adjacent holes.

Hereinafter, referring to FIG. 3, another first electrode 10 is described.

Figure 3A:
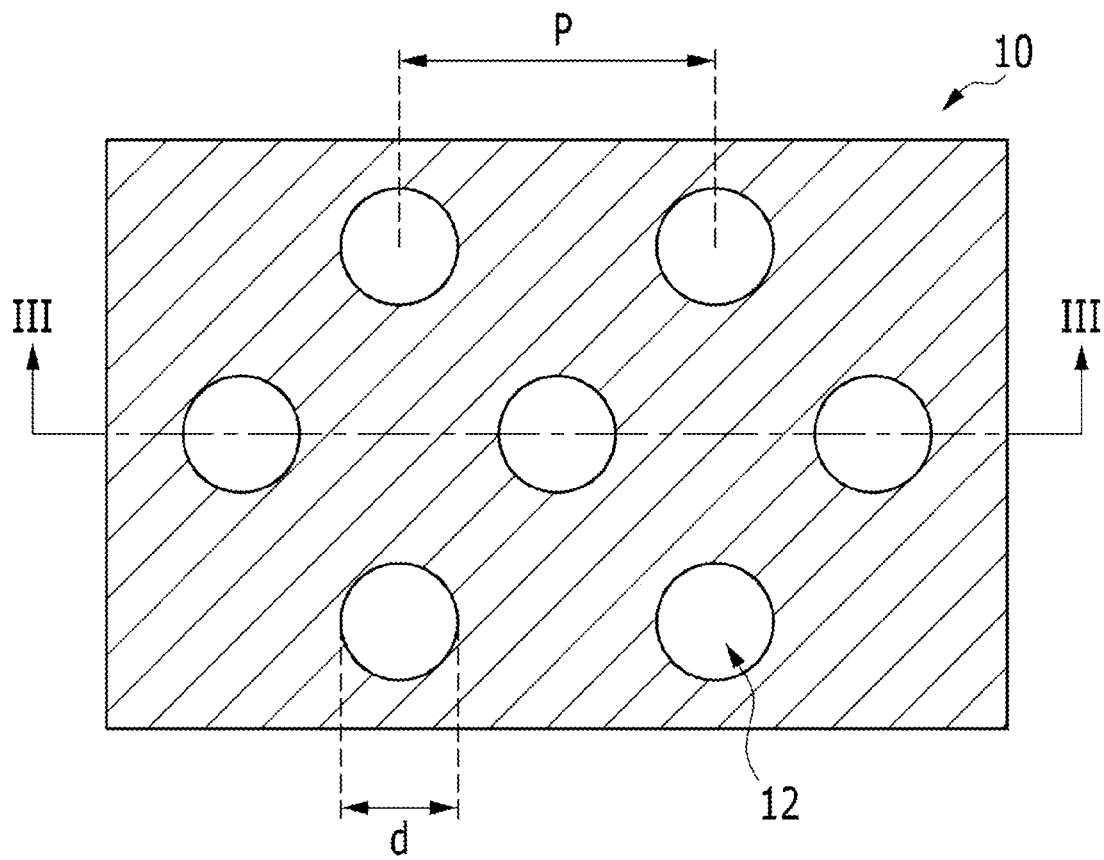
Figure 3B:
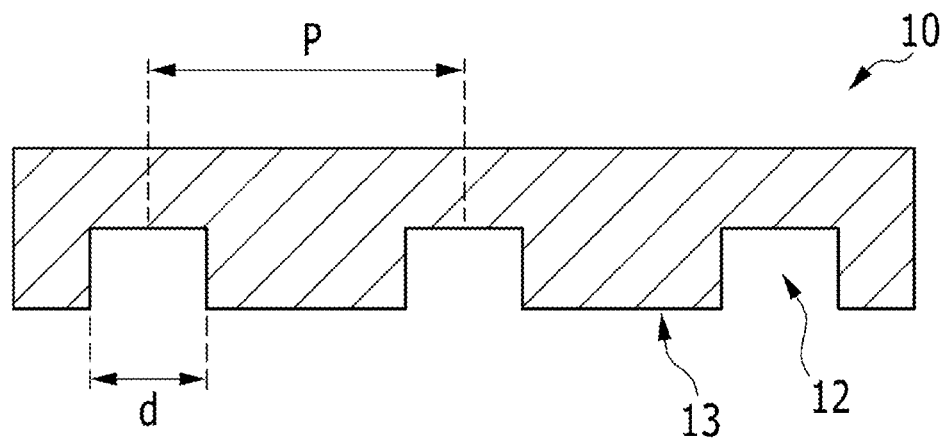

FIG. 3 (A) is a top plan view showing one example of a first electrode in an organic photoelectronic device according to example embodiments, and FIG. 3 (B) is a cross-sectional view taken along a III-III line of FIG. 3 (A).

Referring to FIGS. 3 (A) and (B), the first electrode 10 has a plurality of protrusions 13 and depressions 12 formed on one side of the first electrode 10. Each protrusion 13 and depression 12 has a predetermined or given size, and may have various shapes, e.g., a circle, a quadrangle, and/or a hexagon. A plurality of protrusions 13 and depressions 12 may be regularly arranged in a row, column, and/or diagonal direction at uniform intervals.

The protrusions 13 and depressions 12 are regularly arranged at predetermined or given intervals (P) and with a predetermined or given size (d), and thus selectively reflect light in a predetermined or given wavelength region of the incident light to the active layer 30 and transmit light in the remaining wavelength regions. Herein, the wavelength region to be reflected may be the same as the wavelength region that the active layer 30 mainly absorbs, and for example, when the active layer 30 absorbs light in a blue wavelength region, the first electrode 10 may reflect light in a blue wavelength region to the active layer 30, when the active layer 30 absorbs light in a red wavelength region, the first electrode 10 may reflect light in a red wavelength region to the active layer 30, and when the active layer 30 absorbs light in a green wavelength region, the first electrode 10 may reflect light in a green wavelength region to the active layer 30.

The wavelength region to be reflected may be controlled by sizes (d) of the protrusions 13 and depressions 12 and intervals (P) between adjacent protrusions 13 and depressions 12. For example, the first electrode 10 may simultaneously satisfy the following Relationship Equations 1 and 2.

$\lambda_{max} > d$      [Relationship Equation 1]

$\lambda_{max} > P$      [Relationship Equation 2]

In the Relationship Equations 1 and 2, $\lambda_{max}$ is a maximum absorption wavelength of a wavelength region to be reflected, d is a diameter of nanopatterns, that is, protrusions and depressions, and P is an interval between adjacent nanopatterns, that is, an interval between adjacent protrusions and depressions.

As described above, the organic photoelectronic device 100 has a plurality of nanopatterns arranged at a regular interval on the first electrode 10, and thus may reflect light having a predetermined or given wavelength to the active layer 30 and increases light absorbance of the active layer 30. Accordingly, while the thickness of the active layer 30 is not increased, light absorbance may increase and thus a decrease of photoconversion efficiency according to an increase of thickness of the active layer 30 may be inhibited and light absorbance increases, resulting in improvement of efficiency of the organic photoelectronic device.

Figure 4:
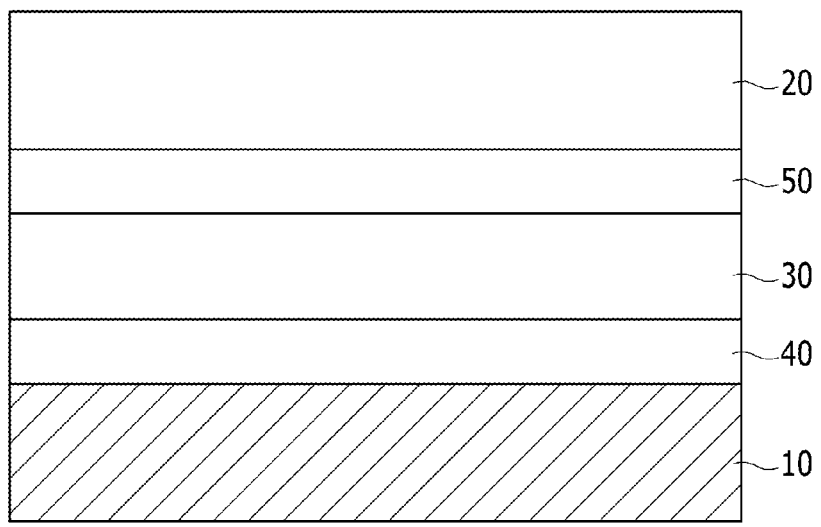
FIG. 4 is a cross-sectional view of an organic photoelectronic device according to example embodiments.

Referring to FIG. 4, an organic photoelectronic device according to example embodiments is described.

FIG. 4 is a cross-sectional view of an organic photoelectronic device according to example embodiments.

Referring to FIG. 4, an organic photoelectronic device 200 according to example embodiments includes a first electrode 10 and a second electrode 20 facing each other, and an active layer 30 interposed between the first electrode 10 and the second electrode 20, like the example embodiment illustrated in FIG. 1.

The first electrode 10, the second electrode 20, and the active layer 30 are the same as described above.

However, the organic photoelectronic device 200 according to example embodiments may further include charge auxiliary layers 40 and 50 between the first electrode 10 and the active layer 30, and the second electrode 20 and the active layer 30, unlike the example embodiment illustrated in FIG. 1. One of the charge auxiliary layers 40 and 50 may be omitted.

The charge auxiliary layers 40 and 50 may be at least one selected from a hole injection layer (HIL) for facilitating hole injection, a hole transport layer (HTL) for facilitating hole transport, an electron blocking layer (EBL) for preventing or inhibiting electron transport, an electron injection layer (EIL) for facilitating electron injection, an electron transport layer (ETL) for facilitating electron transport, and a hole blocking layer (HBL) for preventing or inhibiting hole transport.

The charge auxiliary layers 40 and 50 may include, for example, an organic material, an inorganic material, or an organic/inorganic material. The organic material may be an organic compound having hole or electron characteristics, and the inorganic material may be, for example, a metal oxide (e.g., molybdenum oxide, tungsten oxide, and/or nickel oxide).

The hole transport layer (HTL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4''-tris(N-carbazolyl)-triphenylamine (TCTA), and a combination thereof, but is not limited thereto. The electron blocking layer (EBL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4''-tris(N-carbazolyl)-triphenylamine (TCTA), and a combination thereof, but is not limited thereto.

The electron transport layer (ETL) may include one selected from, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

The hole blocking layer (HBL) may include one selected from, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

Hereinafter, an example of an image sensor including the organic photoelectronic device is described.

Figure 5:
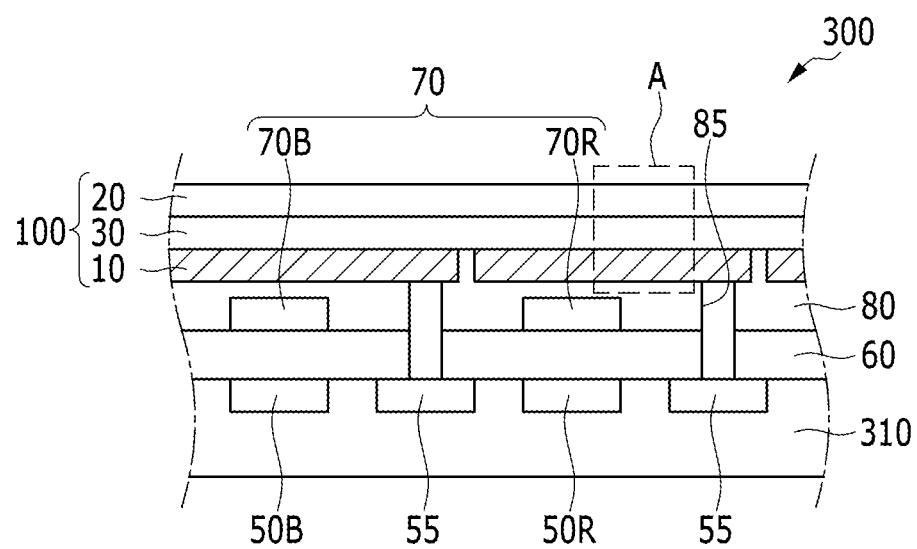
FIG. 5 is a cross-sectional view of an image sensor according to example embodiments.

FIG. 5 is a cross-sectional view of an image sensor 300 according to example embodiments.

The image sensor according to example embodiments may include a first pixel, a second pixel, and a third pixel that are adjacent to each other. The first pixel, the second pixel, and the third pixel may have different absorption wavelength regions in a visible ray region, for example about 400 to 700 nm. For example, the first pixel may be a blue pixel sensing light in a blue wavelength region, the second pixel may be a red pixel sensing light in a red wavelength region, and the third pixel may be a green pixel sensing light in a green wavelength region.

The blue wavelength region may have a maximum absorption wavelength ($\lambda_{max}$) at greater than or equal to about 400 nm and less than about 500 nm, the red wavelength region may have a maximum absorption wavelength ($\lambda_{max}$) at greater than about 580 nm and less than or equal to about 700 nm, and the green wavelength region may have a maximum absorption wavelength ($\lambda_{max}$) at about 500 nm to about 580 nm.

The blue pixel, the red pixel, and the green pixel may be repeatedly arranged as one group along a row and/or column. However, arrangement of a pixel may be modified variously.

Referring to FIG. 5, an image sensor 300 according to example embodiments includes a semiconductor substrate 310 integrated with a blue photoelectronic device 50B sensing light in a blue wavelength region and a red photoelectronic device 50R sensing light in a red wavelength region, and an organic photoelectronic device 100 positioned on one side of the semiconductor substrate 310 and absorbing light in a green wavelength region.

The semiconductor substrate 310 may be a silicon substrate, and is integrated with the blue photoelectronic device 50B, the red photoelectronic device 50R, a charge storage device 55, and a transmission transistor (not shown). The blue photoelectronic device 50B and red photoelectronic device 50R may be photodiodes. The charge storage device 55 may be electrically connected with the organic photoelectronic device 100.

The blue photoelectronic device 50B and the transmission transistor may be integrated in each blue pixel, the red photoelectronic device 50R and the transmission transistor may be integrated in each red pixel, and the charge storage device 55 and the transmission transistor may be integrated in each green pixel.

A metal wire (not shown) and a pad (not shown) are formed on the semiconductor substrate 310. In order to decrease signal delay, the metal wire and pad may be made of a metal having relatively low resistivity, for example, aluminum (Al), copper (Cu), silver (Ag), and alloys thereof, but is not limited thereto. However, it is not limited to the structure, and the metal wire and pad may be positioned under the blue photoelectronic device 50B, the red photoelectronic device 50R, and the charge storage device 55.

A lower insulation layer 60 is formed on the metal wire and the pad. The lower insulation layer 60 may be made of an inorganic insulating material, e.g., a silicon oxide and/or a silicon nitride, or a low dielectric constant (low K) material, e.g., SiC, SiCOH, SiCO, and SiOF.

The lower insulation layer 60 has a trench exposing the photoelectronic devices 50B and 50R and the charge storage device 55 of each pixel. The trench may be filled with fillers.

A color filter layer 70 is formed on the lower insulation layer 60. The color filter layer 70 may include a blue filter 70B formed in the blue pixel and a red filter 70R filled in the red pixel. The color filter 70B of the blue pixel absorbs light in a blue wavelength region and transfers the light to the blue photoelectronic device 50B, and the color filter 70R of the red pixel absorbs light in a red wavelength region and transfers the light to the red photoelectronic device 50R. The green pixel does not include a color filter.

An upper insulation layer 80 is formed on the color filter layer 70. The upper insulation layer 80 eliminates a step caused by the color filter layer 70 and smoothes the surface. The upper insulation layer 80 and lower insulation layer 60 may include a contact hole (not shown) exposing a pad, and a through-hole 85 exposing the charge storage device 55 of a green pixel.

The organic photoelectronic device 100 is formed on the upper insulation layer 80. The organic photoelectronic device 100 may include a first electrode 10 and a second electrode 20 facing each other, and an active layer 30 interposed between the first electrode 10 and the second electrode 20.

The active layer 30 selectively absorbs light in a green wavelength region, and transmits light in other wavelength regions besides the green wavelength region, that is, light in a blue wavelength region and a red wavelength region.

The active layer 30 may include a p-type semiconductor and an n-type semiconductor absorbing light in a visible ray region, and at least one of the p-type semiconductor and the n-type semiconductor may selectively absorb light in a green wavelength region. The p-type semiconductor and the n-type semiconductor may form a pn junction, and may selectively absorb light in a green wavelength region to generate excitons, and then the generated excitons may be separated into holes and electrons to provide a photoelectric effect. The active layer 30 may replace a color filter of a green pixel.

Each of the p-type semiconductor and the n-type semiconductor may have an energy bandgap of, for example, about 2.0 to about 2.5 eV, and the p-type semiconductor and the n-type semiconductor may have a LUMO difference of, for example, about 0.2 to about 0.7 eV.

The p-type semiconductor material may be, for example, quinacridone or a derivative thereof, and the n-type semiconductor material may be, for example, a cyanovinyl group-containing thiophene derivative, fullerene, or a fullerene derivative, but are not limited thereto.

The active layer 30 may be a single layer or a multilayer. The active layer 30 may be, for example, an intrinsic layer (I layer), a p-type layer/I layer, an I layer/n-type layer, a p-type layer/I layer/n-type layer, and/or a p-type layer/n-type layer.

The intrinsic layer (I layer) may include the p-type semiconductor and the n-type semiconductor in a thickness ratio of about 1:100 to about 100:1. The compounds may be included in a thickness ratio ranging from about 1:50 to about 50:1 within the range, specifically, about 1:10 to about 10:1, and more specifically, about 1 to about 1. When the p-type and n-type semiconductors have a composition ratio within the range, an exciton may be effectively produced, and a pn junction may be effectively formed.

The p-type layer may include the p-type semiconductor, and the n-type layer may include the n-type semiconductor.

The active layer 30 may have a thickness of about 1 nm to about 500 nm. Within the range, the active layer 30 may have a thickness of about 5 nm to about 300 nm. When the active layer 30 has a thickness within the range, the active layer may effectively absorb light, effectively separate holes from electrons, and deliver them, effectively improving photoelectric conversion efficiency.

One of the first electrode 10 and the second electrode 120 is an anode and the other is a cathode. The first electrode 10 and the second electrode 20 may be light-transmitting electrodes, and the light-transmitting electrode may be made of, for example, a transparent conductor (e.g., indium tin oxide (ITO) or indium zinc oxide (IZO)), or may be a metal thin layer having a thin thickness of several nanometers or several tens of nanometers or a metal thin layer having a thin thickness of several nanometers to several tens of nanometers doped with a metal oxide.

The first electrode 10 may have a plurality of nanopatterns arranged at a regular interval. The nanopatterns may be holes, recess portions, protruding portions, protrusions and depressions, or combinations thereof that have sizes of several nanometers to hundreds of nanometers, and their shapes are not particularly limited.

The first electrode 10 may have a first side contacting the active layer 30 and a second side facing the first side. The second side may contact the upper insulation layer 80. When the nanopatterns are holes, the holes may be formed to penetrate the first electrode 10 from the first side to the second side. When the nanopatterns are protrusions and depressions or a combination thereof, the protrusions and depressions may be formed on the second side.

The plurality of nanopatterns are regularly arranged at predetermined or given intervals and with a predetermined or given size, and thus selectively reflect light in a predetermined or given wavelength region of the incident light to the active layer 30 and transmit light in the remaining wavelength regions. Therefore, light to be selectively reflected may be absorbed by the active layer 30 again to increase absorbance of the active layer 30.

The light to be selectively reflected may be, for example, one of a blue wavelength region, a red wavelength region, and a green wavelength region, wherein the blue wavelength region may be, for example, a maximum absorption wavelength ($\lambda_{max}$) at greater than or equal to about 400 nm and less than about 500 nm, the red wavelength region may be, for example, a maximum absorption wavelength ($\lambda_{max}$) at greater than about 580 nm and less than or equal to about 700 nm, and the green wavelength region may be, for example, a maximum absorption wavelength ($\lambda_{max}$) at about 500 nm to about 580 nm.

Figure 6:
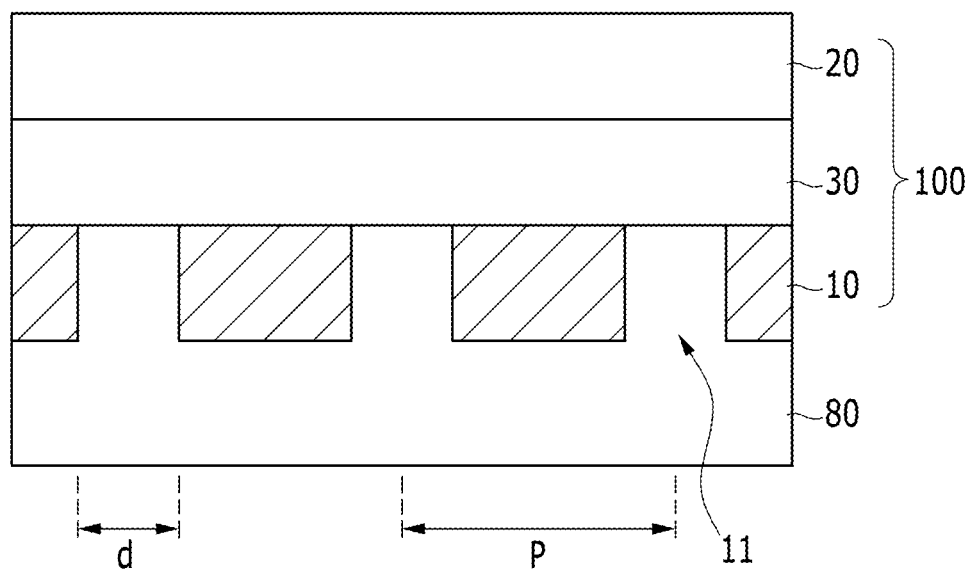
FIG. 6 is a cross-sectional view enlarging the 'A' part of FIG. 5 according to example embodiments.

FIG. 6 is a cross-sectional view enlarging the 'A' part of FIG. 5.

Referring to FIG. 6, the first electrode 10 may have a plurality of holes 11 to penetrate the first electrode 10 from one side of the first electrode 10 to the other side. Each hole 11 has a predetermined or given size, and may have various shapes, e.g., a circle, a quadrangle, and/or a hexagon. A plurality of holes 11 may be regularly arranged in a row, column, and/or diagonal direction at uniform intervals.

As described above, the holes 11 may be regularly formed with a predetermined or given interval (P) and a predetermined or given size (d), and thus selectively reflect light in a predetermined or given wavelength region of the incident light to the active layer 30 and transmit light in the remaining wavelength regions. Herein, the wavelength region to be reflected may be the same as the wavelength region that the active layer 30 mainly absorbs, and when the active layer 30 absorbs light in a green wavelength region, the first electrode 10 may reflect light in a green wavelength region to the active layer 30.

The wavelength region to be reflected may be controlled by sizes (d) of the holes 11 and intervals (P) between adjacent holes 11. For example first electrode 10 may simultaneously satisfy the following Relationship Equations 1 and 2.

$$\lambda_{max} > d \quad \text{[Relationship Equation 1]}$$

$$\lambda_{max} > P \quad \text{[Relationship Equation 2]}$$

In the Relationship Equations 1 and 2, $\lambda_{max}$ is a maximum absorption wavelength of a wavelength region to be reflected, d is a diameter of nanopatterns, that is, holes, and P is an interval between adjacent nanopatterns, that is, an interval between adjacent holes.

On the other hand, the upper insulation layer 80 contacting the first electrode 10 may have a smaller refractive index than the first electrode 10, and thus transmittance of the light transmitting through the first electrode 10 does not substantially decrease and light in a green wavelength region may be effectively reflected. For example, the first electrode 10 and the upper insulation layer 80 may have a refractive index difference of greater than or equal to about 0.05. Within the refractive index difference range, transmittance of light transmitting through the first electrode 10 decreases by about 2% or less, and simultaneously, light in a green wavelength region may be effectively reflected so that an absorption rate of light in a green wavelength region of the active layer 30 may increase by about 10% or more.

Figure 7:
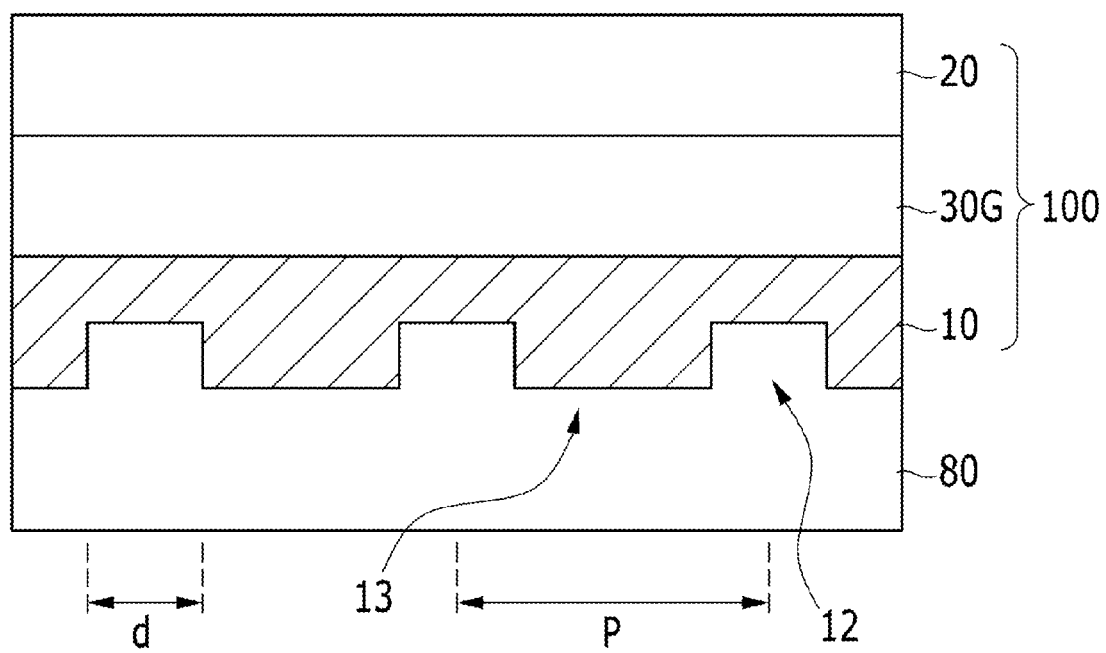
FIG. 7 is a cross-sectional view enlarging the 'A' part of FIG. 5 according to example embodiments.

FIG. 7 is a cross-sectional view enlarging the 'A' part of FIG. 5.

Referring to FIG. 7, the first electrode 10 has a plurality of protrusions 13 and depressions 12 formed on one side of the first electrode 10. The protrusions 13 and depressions 12 may be formed on one side not contacting the active layer 30, that is, one side contacting the upper insulation layer 80. Each protrusion 13 and depression 12 has a predetermined or given size, and may have various shapes, e.g., a circle, a quadrangle, and/or a hexagon. A plurality of protrusions 13 and depressions 12 may be regularly arranged in a row, column, and/or diagonal direction with a uniform interval.

As described above, the protrusions 13 and depressions 12 are regularly arranged at a predetermined or given interval (P) and with a predetermined or given size (d), and thus selectively reflect light in a predetermined or given wavelength region of the incident light to the active layer 30 and transmit light in the remaining wavelength regions. Herein, the wavelength region to be reflected may be the same as the wavelength region that the active layer 30 mainly absorbs, and when the active layer 30 absorbs light in a green wavelength region, the first electrode 10 may reflect light in a green wavelength region to the active layer 30.

The wavelength region to be reflected may be controlled by sizes (d) of the protrusions 13 and depressions 12 and intervals (P) between adjacent protrusions 13 and depressions 12. For example, the first electrode 10 may have may simultaneously satisfy the following Relationship Equations 1 and 2.

$$\lambda_{max} > d \quad \text{[Relationship Equation 1]}$$

$$\lambda_{max} > P \quad \text{[Relationship Equation 2]}$$

In the Relationship Equations 1 and 2, $\lambda_{max}$ is a maximum absorption wavelength of a wavelength region to be reflected, d is a diameter of nanopatterns, that is, protrusions and depressions, and P is an interval between adjacent nanopatterns, that is, an interval between adjacent protrusions and depressions.

On the other hand, the upper insulation layer 80 contacting the first electrode 10 may have a smaller refractive index than the first electrode 10, and thus transmittance of the light transmitting through the first electrode 10 does not substantially decrease and light in a green wavelength region may be effectively reflected. For example, the first electrode 10 and the upper insulation layer 80 may have a refractive index difference of greater than or equal to about 0.05. Within the refractive index difference range, transmittance of the light transmitting through the first electrode 10 decreases by about 2% or less, and simultaneously, light in a green wavelength region may be effectively reflected so that an absorption rate of light in a green wavelength region of the active layer 30 may increase by about 10% or more.

As described above, the organic photoelectronic device 100 has a plurality of nanopatterns arranged at a regular interval on the first electrode 10 and thus may reflect light having a predetermined or given wavelength to the active layer 30 and increase light absorbance of the active layer 30. Accordingly, while the thickness of the active layer 30 is not increased, light absorbance may increase and thus a decrease of photoconversion efficiency according to an increase of a thickness of the active layer 30 may be inhibited and light absorbance increases resulting in improvement of efficiency of the organic photoelectronic device.

In the organic photoelectronic device 100, when light enters from the second electrode 20, and when the active layer 30 absorbs light having a predetermined or given wavelength region, excitons may be produced from the inside. The excitons are separated into holes and electrons in the active layer 30, and the separated holes are transported to an anode that is one of the first electrode 10 and second electrode 20 and the separated electrons are transported to the cathode that is the other of and the first electrode 10 and second electrode 20 so as to flow a current in the organic photoelectronic device. The separated electrons or holes may be gathered in the charge storage device 55. Light in other wavelength regions except for a green wavelength region pass through the first electrode 10 and the color filters 70B and 70O and may be sensed by the blue photoelectronic device 50B or the red photoelectronic device 50R.

The active layer 30 may be formed on the front of the image sensor 300, and absorb light thereon, and thus increase a light absorbing area and bring about high absorption efficiency.

On the organic photoelectronic device 100, a focusing lens (not shown) may be further formed. The focusing lens may control a direction of incident light and gather the light in one region. The focusing lens may have a shape of, for example, a cylinder or a hemisphere, but is not limited thereto.

The organic photoelectronic device 100 is an example of selectively absorbing light in a green wavelength region, but is not limited thereto. The organic photoelectronic device 100 may selectively absorb light in a blue wavelength region or in a red wavelength region.

Figure 8:
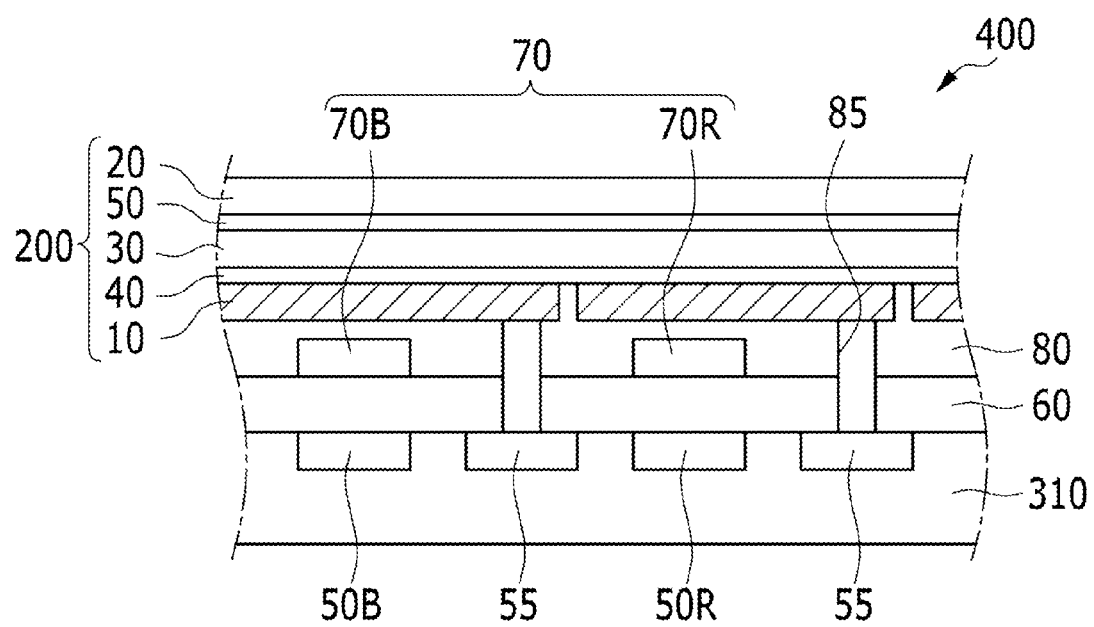
FIG. 8 is a cross-sectional view of an image sensor according to example embodiments.

FIG. 8 is a cross-sectional view of an image sensor 400 according to example embodiments.

Referring to FIG. 8, the image sensor 400 according to example embodiments may include a semiconductor substrate 310 integrated with a blue photoelectronic device 50B, a red photoelectronic device 50R, a charge storage device 55, and a transmission transistor (not shown), a lower insulation layer 60, a color filter layer 70, an upper insulation layer 80, and an organic photoelectronic device 100, like the example embodiment illustrated in FIG. 5.

However, the image sensor according to example embodiments may include charge auxiliary layers 40 and 50 between the first electrode 10 and the active layer 30 and between the second electrode 20 and the active layer 30, unlike the example embodiment illustrated in FIG. 5. One of the charge auxiliary layers 40 and 50 may be omitted. The charge auxiliary layers 40 and 50 are the same as described above.

Figure 9:
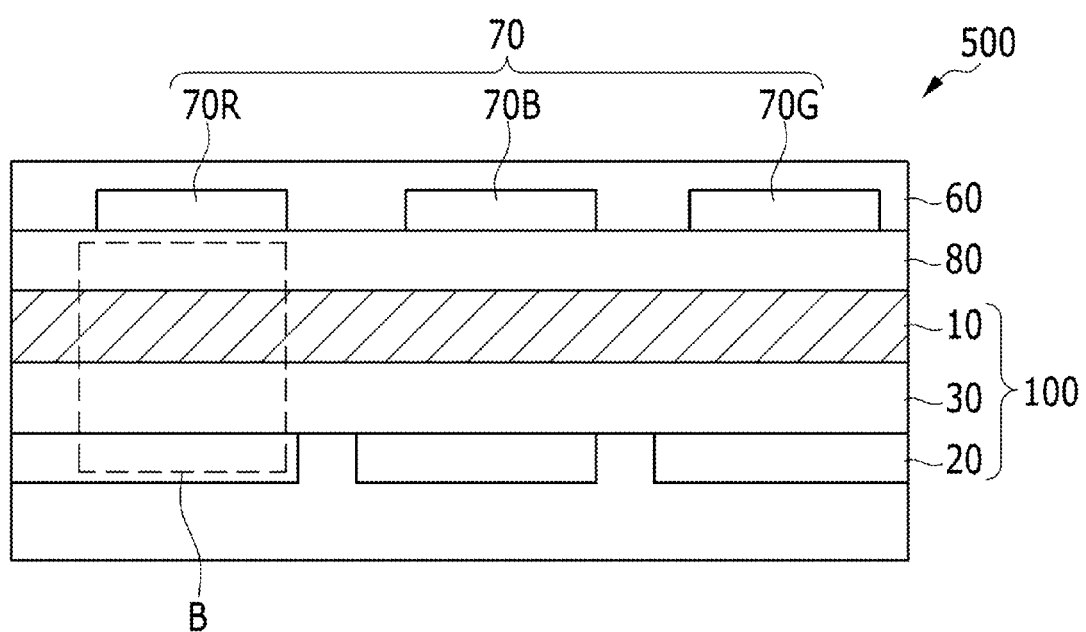
FIG. 9 is a cross-sectional view of an image sensor according to yet example embodiments.

FIG. 9 is a cross-sectional view of an image sensor 500 according to example embodiments.

Referring to FIG. 9, the image sensor 500 according to example embodiments may include an organic photoelectronic device 100 including a first electrode 10, an active layer 30, and a second electrode 20, an insulation layer 80 positioned on one side of the organic photoelectronic device 100, a color filter layer 70 positioned on one side of the insulation layer 80, and a planarization layer 60 positioned on one side of the color filter layer 70.

The active layer 30 may include an organic material absorbing light in a full visible ray region of about 400 nm to about 700 nm. The active layer 30 may include a p-type semiconductor and an n-type semiconductor, and for example, at least one of the p-type semiconductor and the n-type semiconductor may absorb light in a full visible ray region.

The active layer 30 may include at least two selected from, for example, polyaniline; polypyrrole; polythiophene; poly(p-phenylenevinylene); benzodithiophene; thienothiophene; MEH-PPV (poly[2-methoxy-5-(2'-ethyl-hexyloxy)-1,4-phenylene]vinylene); (poly[2-methoxy-5-(3,7-dimethyloctyloxy)-1,4-phenylene]vinylene); pentacene; perylene; poly(3,4-ethylenedioxythiophene) (PEDOT); poly(3-alkyl-thiophene); poly((4,8-bis(octyloxy)benzo(1,2-b:4,5-b)dithiophene)-2,6-diyl-alt-(2-((dodecyloxy)carbonyl)thieno(3,4-b)thiophenediyl)-3,6-diyl) (PTB1); poly((4,8-bis(2-ethylhexyloxy)benzo[1,2-b:4,5-b']dithiophene)-2,6-diyl-alt-(2-((2-ethylhexyloxy)carbonyl)-3-fluorothieno[3,4-b]thiophenediyl)-3,6-diyl) (PTB7); phthalocyanine; tin(II) phthalocyanine (SnPc); copper phthalocyanine; triarylamine; benzidine; pyrazoline; styrylamine; hydrazone; carbazole; thiophene; 3,4-ethylenedioxythiophene (EDOT); pyrrole; phenanthrene; tetracene; naphthalene; rubrene; 1,4,5,8-naphthalene-tetracarboxylic dianhydride (NTCDA); Alq3; fullerene (C60, C70, C74, C76, C78, C82, C84, C720, and/or C860); a fullerene derivative, e.g., 1-(3-methoxy-carbonyl)propyl-1-phenyl(6,6)C61 (PCBM), C71-PCBM, C84-PCBM, and/or bis-PCBM; an inorganic semiconductor, e.g., CdS, CdTe, CdSe, and/or ZnO; a derivative thereof; and a copolymer thereof, but is not limited thereto.

One of the first electrode 10 and the second electrode 120 is an anode and the other is a cathode. At least one of the first electrode 10 and the second electrode 20 may be a light-transmitting electrode.

For example, the first electrode 10 may be a light-transmitting electrode and the second electrode 20 may be a non-light-transmitting electrode. The first electrode 10 an incident light electrode into which light enters. The light-transmitting electrode may be made of, for example, a transparent conductor (e.g., indium tin oxide (ITO) or indium zinc oxide (IZO)), or a metal thin layer of a thin monolayer or multilayer, and the non-light-transmitting electrode may be made of, for example, a non-light-transmitting conductor (e.g., aluminum (Al)).

The first electrode 10 may have a plurality of nanopatterns arranged at a regular interval. The nanopatterns may be holes, recess portions, protruding portions, protrusions and depressions, or combinations thereof that have sizes of several nanometers to hundreds of nanometers, and their shapes are not particularly limited.

The first electrode 10 may have a first side contacting the active layer 30 and a second side facing the first side. The second side may contact the insulation layer 80. When the nanopatterns are holes, the holes may be formed to penetrate from the first side to the second side. When the nanopatterns are protrusions and depressions or a combination thereof, the protrusions and depressions may be formed on the second side.

The plurality of nanopatterns are regularly arranged at predetermined or given intervals and with a predetermined or given size, and thus selectively reflect light in a predetermined or given wavelength region of the incident light to the active layer 30 and transmit light in the remaining wavelength regions. Therefore, light to be selectively reflected may be absorbed by the active layer 30 again to increase absorbance of the active layer 30.

The light to be selectively reflected may be, for example, one of a blue wavelength region, a red wavelength region, and a green wavelength region, wherein the blue wavelength region may be, for example, a maximum absorption wavelength ($\lambda_{max}$) at greater than or equal to about 400 nm and less than about 500 nm, the red wavelength region may be, for example, a maximum absorption wavelength ($\lambda_{max}$) at greater than about 580 nm and less than or equal to about 700 nm, and the green wavelength region may be, for example, a maximum absorption wavelength ($\lambda_{max}$) at about 500 nm to about 580 nm.

The wavelength region to be reflected may be the same as the wavelength region that the color filter of the color filter layer 70 absorbs, and for example, the first electrode 10 positioned under the red filter 70R of the red pixel may reflect light in a red wavelength region to the active layer 30, the first electrode 10 positioned under the blue filter 70B of the blue pixel may reflect light in a blue wavelength region to the active layer 30, and the first electrode 10 positioned under the green filter 700 of the green pixel may reflect light in a green wavelength region to the active layer 30.

Light in a predetermined or given wavelength region of light reflected from the second electrode 20 is reflected by nanopatterns of the first electrode 10 to the active layer 30 and thus light absorbance of the active layer 30 may increase.

Figure 10:
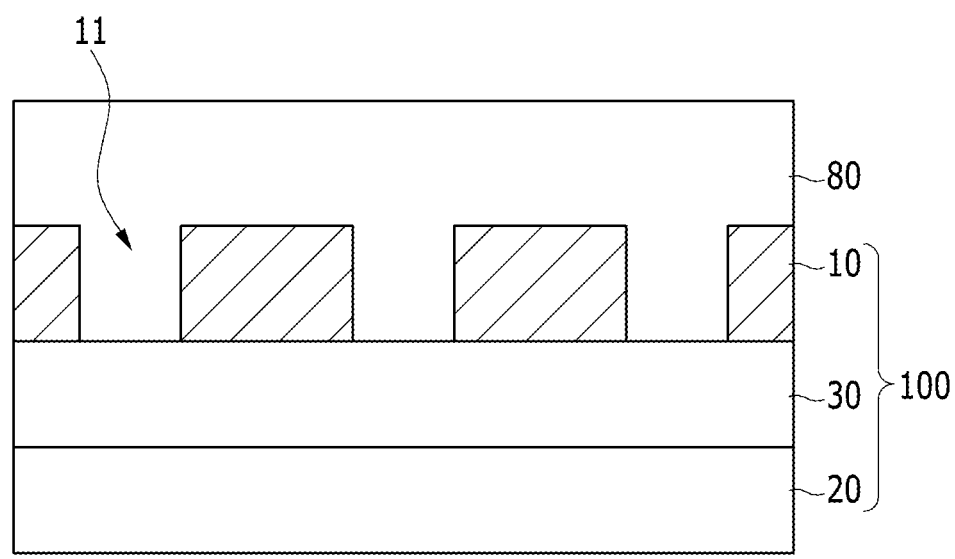
FIG. 10 is a cross-sectional view enlarging the 'B' part of FIG. 9 according to example embodiments.

FIG. 10 is a cross-sectional view enlarging the 'B' part of FIG. 9.

Referring to FIG. 10, the first electrode 10 may have a plurality of holes 11 to penetrate the first electrode 10 from one side of the first electrode 10 to the other side. Each hole 11 has a predetermined or given size, and may have various shapes, e.g., a circle, a quadrangle, and/or a hexagon. A plurality of holes 11 may be regularly arranged in a row, column, and/or diagonal direction at uniform intervals.

The holes 11 may be regularly spaced with a predetermined or given interval (P) and a predetermined or given size (d) and thus selectively reflect light in a predetermined or given wavelength region of the incident light to the active layer 30 and transmit light in the remaining wavelength regions.

The wavelength region to be reflected may be controlled by sizes (d) of the holes 11 and intervals (P) between adjacent holes 11. For example the first electrode 10 may simultaneously satisfy the following Relationship Equations 1 and 2.

$$\lambda_{max} > d \quad \text{[Relationship Equation 1]}$$

$$\lambda_{max} > P \quad \text{[Relationship Equation 2]}$$

In the Relationship Equations 1 and 2, $\lambda_{max}$ is a maximum absorption wavelength of a wavelength region to be reflected, d is a diameter of nanopatterns, that is, holes, and P is an interval between adjacent nanopatterns, that is, an interval between adjacent holes.

On the other hand, the insulation layer 80 contacting the first electrode 10 may have a smaller refractive index than the first electrode 10, and thus transmittance of the light transmitting through the first electrode 10 does not substantially decrease and light in a green wavelength region may be effectively reflected. For example, the first electrode 10 and the insulation layer 80 may have a refractive index difference of greater than or equal to about 0.05. Within the refractive index difference range, transmittance of the light transmitting through the first electrode 10 decreases by about 2% or less and simultaneously light in a green wavelength region may be effectively reflected so that an absorption rate of light in a green wavelength region of the active layer 30 may increase by about 10% or more.

Figure 11:
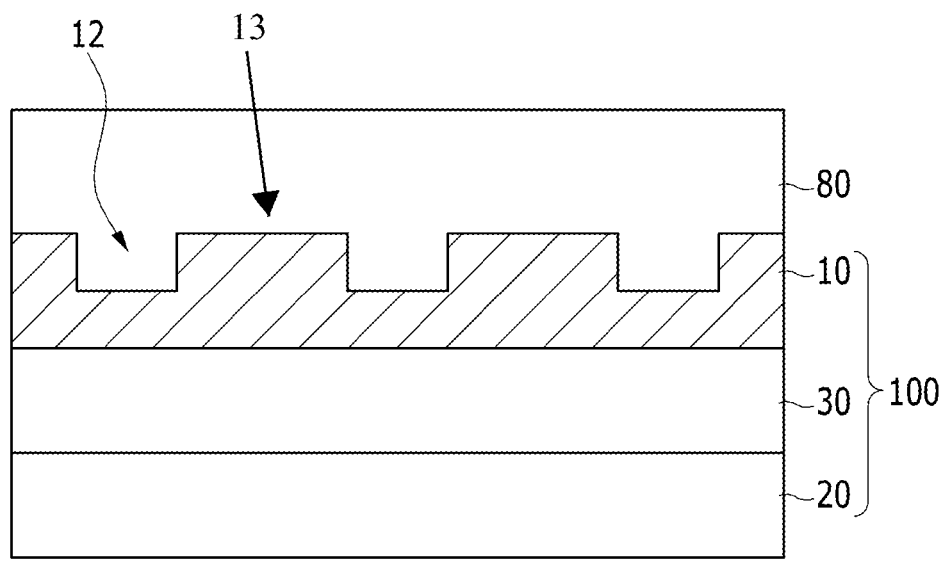
FIG. 11 is a cross-sectional view enlarging the 'B' part of FIG. 9 according to example embodiments.

FIG. 11 is a cross-sectional view enlarging the 'B' part of FIG. 9.

Referring to FIG. 11, the first electrode 10 has a plurality of protrusions 13 and depressions 12 formed on one side of the first electrode 10. The protrusions 13 and depressions 12 may be formed on one side not contacting the active layer 30, that is, one side contacting the upper insulation layer 80. Each protrusion 13 and depression 12 has a predetermined or given size, and may have various shapes, e.g., a circle, a quadrangle, and/or a hexagon. A plurality of protrusions 13 and depressions 12 may be regularly arranged in a row, column, and/or diagonal direction at uniform intervals.

As described above, the protrusions 13 and depressions 12 are regularly arranged at predetermined or given intervals (P) and with a predetermined or given size (d) and thus selectively reflect light in a predetermined or given wavelength region of the incident light to the active layer 30 and transmit light in the remaining wavelength regions.

The wavelength region to be reflected may be controlled by sizes (d) of the protrusions 13 and depressions 12 and intervals (P) between adjacent protrusions 13 and depressions 12. For example, the first electrode 10 may have may simultaneously satisfy the following Relationship Equations 1 and 2.

$$\lambda_{max} > d \quad \text{[Relationship Equation 1]}$$

$$\lambda_{max} > P \quad \text{[Relationship Equation 2]}$$

In the Relationship Equations 1 and 2, $\lambda_{max}$ is a maximum absorption wavelength of a wavelength region to be reflected, d is a diameter of nanopatterns, that is, protrusions and depressions, and P is an interval between adjacent nanopatterns, that is, an interval between adjacent protrusions and depressions.

On the other hand, the insulation layer 80 contacting the first electrode 10 may have a smaller refractive index than the first electrode 10, and thus transmittance of the light transmitting through the first electrode 10 does not substantially decrease and light in a green wavelength region may be effectively reflected. For example, the first electrode 10 and the insulation layer 80 may have a refractive index difference of greater than or equal to about 0.05. Within the refractive index difference range, transmittance of the light transmitting through the first electrode 10 decreases by about 2% or less and simultaneously light in a green wavelength region may be effectively reflected so that an absorption rate of light in a green wavelength region of the active layer 30 may increase by about 10% or more.

The active layer 30 may be formed on the front of the image sensor 300, and absorb light thereon, and thus increase a light absorbing area and bring about high absorption efficiency.

On the organic photoelectronic device 100, a focusing lens (not shown) may be further formed. The focusing lens may control a direction of incident light and gather the light in one region. The focusing lens may have a shape of, for example, a cylinder or a hemisphere, but is not limited thereto.

The image sensor may be applied to various electronic devices, for example, a mobile phone, a digital camera, and/or a biosensor.

Hereinafter, the present disclosure is illustrated in more detail with reference to examples. However, these are examples, and the present disclosure is not limited thereto.

Evaluation of Light Absorbance

Light absorbance of an organic photoelectronic device including a light-transmitting electrode having nanopatterns is evaluated using optical simulation.

The optical simulation is a Lumerical FDTD solution program. The Lumerical FDTD solution program may predict relative interactions between the nanopatterns and electromagnetic fields exactly, and shows changes of light absorbance and light absorption wavelength of the active layer depending on the nanopatterns.

The organic photoelectronic device is assumed to include silicon dioxide ($SiO_2$) having a refractive index of about 1.45, a pair of indium tin oxide (ITO) layers having a refractive index of about 1.9, and an active layer including a compound represented by the following Chemical Formula A (p-type semiconductor) and fullerene (C60, n-type semiconductor). One of the indium tin oxide (ITO) layers has a plurality of holes, and changes of light absorption wavelengths of the active layer are confirmed while changing diameters of holes and/or intervals between adjacent holes.

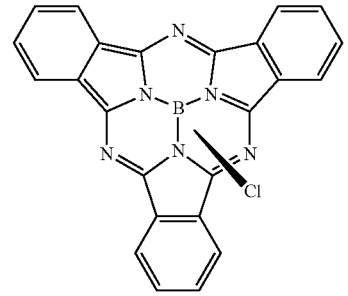

[Chemical Formula A]

Figure 12:
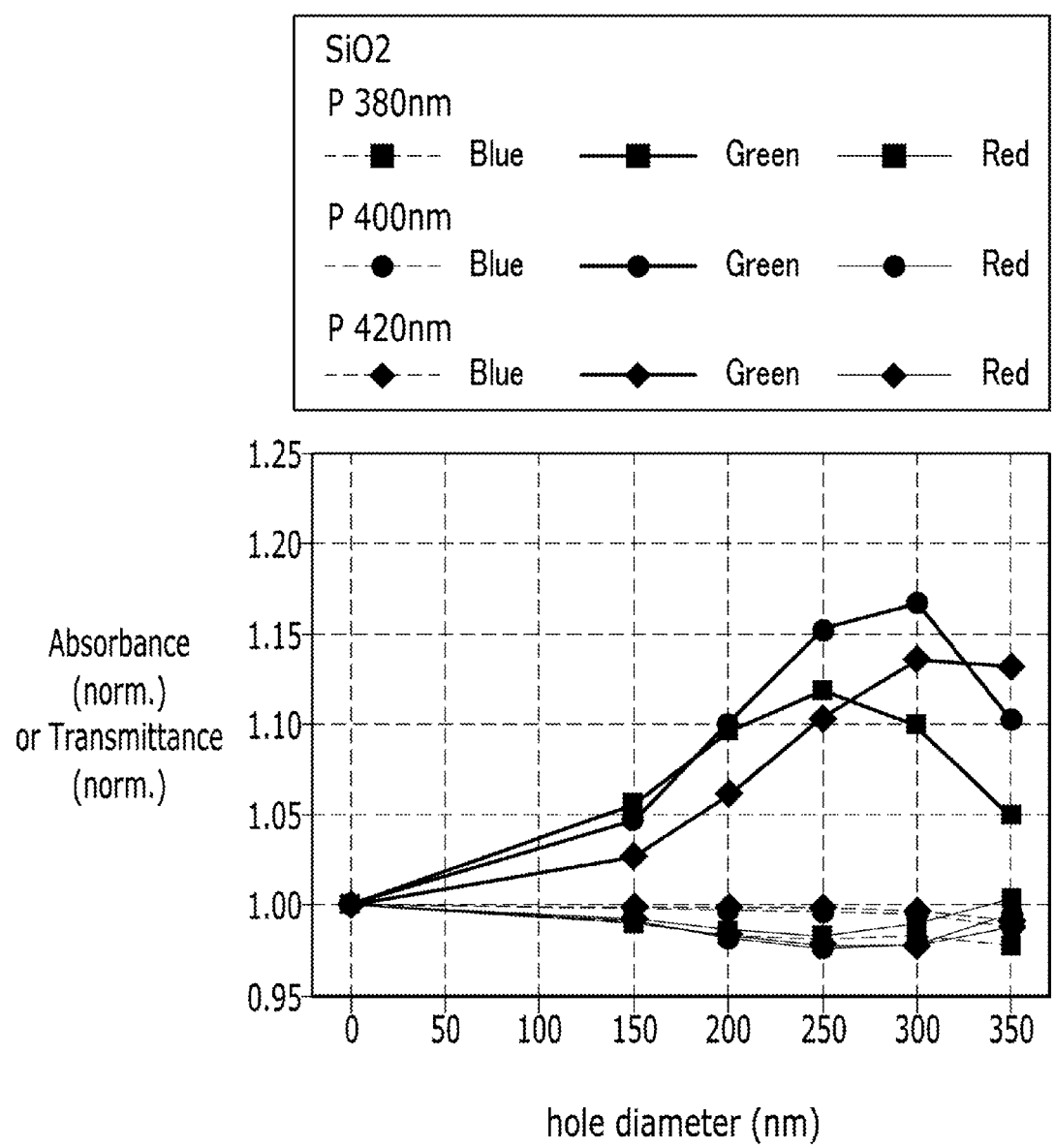
FIG. 12 is a graph showing changes of light absorbance of a red wavelength region, a green wavelength region, and a blue wavelength region of the active layer depending on a diameter of a hole and an interval between the adjacent holes.

FIG. 12 is a graph showing changes of light absorbance of a red wavelength region, a green wavelength region, and a blue wavelength region of the active layer depending on a diameter of a hole and an interval between adjacent holes.

Referring to FIG. 12, when the diameter of the holes is changed to be from 0 nm to 350 nm and the intervals between the adjacent holes are changed to be 380 nm, 400 nm, and 420 nm, light absorbance in a blue wavelength region and in a red wavelength region is not changed significantly while light absorbance in a green wavelength region is changed significantly. Particularly, light absorbance in a green wavelength region increases remarkably when the hole size is about 150 nm to 350 nm. From the result, it can be seen that light absorbance in a predetermined or given wavelength region may be changed by the nanopatterns of the light-transmitting electrode.

Figure 13:
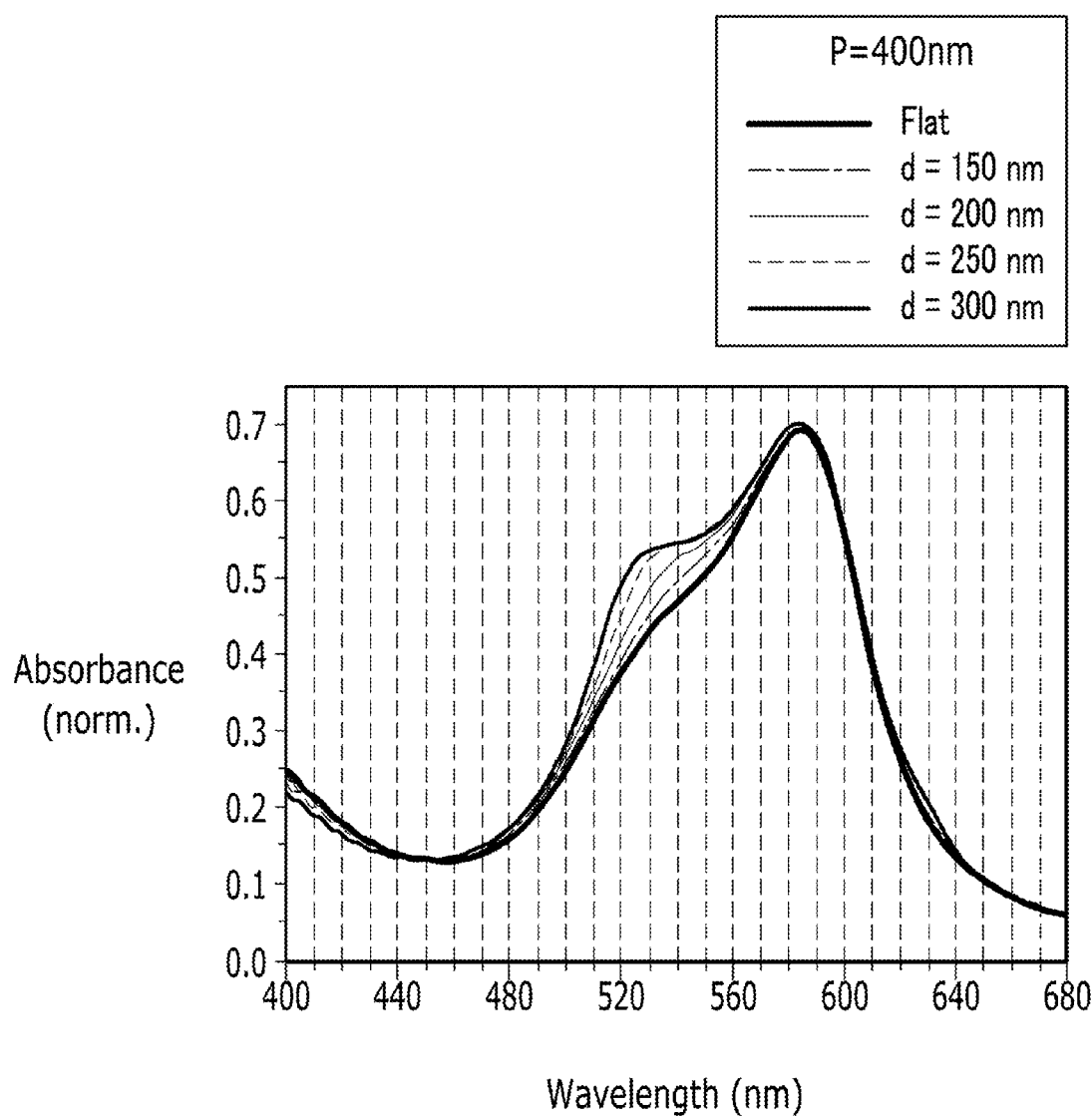
FIG. 13 is a graph showing changes of light absorbance depending on a wavelength when the intervals between adjacent holes are fixed to be 400 nm and the diameters of holes are changed to be 150 nm, 200 nm, 250 nm, and 300 nm.

FIG. 13 is a graph showing changes of light absorbance depending on a wavelength when intervals between adjacent holes are fixed to be 400 nm and diameters of the holes are changed to be 150 nm, 200 nm, 250 nm, and 300 nm.

Referring to FIG. 13, by changing the diameter of the holes, light absorbance in a green wavelength region of about 520 nm to 560 nm may be changed without changing light absorbance of a blue wavelength region and a red wavelength region. From the result, it can be seen that light absorbance in a predetermined or given wavelength region may be changed by the nanopatterns of the light-transmitting electrode.

While this disclosure has been described in connection with what is presently considered to be practical example embodiments, it is to be understood that the inventive concepts are not limited to the disclosed embodiments, but, on the contrary, is intended to cover various modifications and equivalent arrangements included within the spirit and scope of the appended claims.

What is claimed is:

1. An organic photoelectronic device comprising:
a first electrode and a second electrode facing each other, the first electrode including a plurality of nanopatterns arranged at a regular interval; and
an active layer between the first electrode and the second electrode, the active layer configured to absorb light in at least one wavelength region of a visible ray region,
wherein the first electrode is configured to selectively reflect light to the active layer in a wavelength region absorbed by the active layer.

2. The organic photoelectronic device of claim 1, wherein the first electrode has one of a plurality of holes arranged at a regular interval and protrusions and depressions arranged at a regular interval.

3. The organic photoelectronic device of claim 2, wherein
the first electrode has a first side contacting the active layer and a second side facing the first side, and
the protrusions and depressions are on the second side.

4. The organic photoelectronic device of claim 1, wherein the first electrode selectively reflects light to the active layer in one of a blue wavelength region, a red wavelength region, and a green wavelength region.

5. The organic photoelectronic device of claim 4, wherein
the blue wavelength region has a maximum absorption wavelength ($\lambda_{max}$) at greater than or equal to about 400 nm and less than about 500 nm,
the red wavelength region has a maximum absorption wavelength ($\lambda_{max}$) at greater than about 580 nm and less than or equal to about 700 nm, and
the green wavelength region has a maximum absorption wavelength ($\lambda_{max}$) at about 500 nm to about 580 nm.

6. The organic photoelectronic device of claim 5, wherein the first electrode simultaneously satisfies the following Relationship Equations 1 and 2:

$$\lambda_{max} > d \quad \text{[Relationship Equation 1]}$$

$$\lambda_{max} > P \quad \text{[Relationship Equation 2]}$$

wherein, in the Relationship Equations 1 and 2,
$\lambda_{max}$ is a maximum absorption wavelength of a wavelength region to be reflected,
d is a diameter of nanopatterns, and
P is an interval between adjacent nanopatterns.

7. An image sensor comprising:
a semiconductor substrate integrated with a first photoelectronic device configured to sense light in a first wavelength region and a second photoelectronic device configured to sense light in a second wavelength region; and
an organic photoelectronic device on the semiconductor substrate, the organic photoelectronic device configured to selectively absorb light in a third wavelength region and including,
a first electrode and a second electrode facing each other, the first electrode including a plurality of nanopatterns arranged at a regular interval, and
an active layer between the first electrode and the second electrode, the active layer configured to selectively absorb light in the third wavelength region.

8. The image sensor of claim 7, wherein the first electrode has one of a plurality of holes arranged at a regular interval and protrusions and depressions arranged at a regular interval.

9. The image sensor of claim 8, wherein
the first electrode has a first side contacting the active layer and a second side facing the first side, and
the protrusions and depressions are on the second side.

10. The image sensor of claim 7, wherein the first electrode selectively reflects light to the active layer in the third wavelength region.

11. The image sensor of claim 7, wherein the first electrode simultaneously satisfies the following Relationship Equations 1 and 2:

$$\lambda_{max} > d \quad \text{[Relationship Equation 1]}$$

$$\lambda_{max} > P \quad \text{[Relationship Equation 2]}$$

wherein, in the Relationship Equations 1 and 2,
$\lambda_{max}$ is a maximum absorption wavelength of the third wavelength region,
d is a diameter of nanopatterns, and
P is an interval between adjacent nanopatterns.

12. The image sensor of claim 7, further comprising:
an insulation layer between the semiconductor substrate and the organic photoelectronic device, the insulation layer in contact with the first electrode,
wherein the refractive index of the insulation layer is smaller than that of the first electrode.

13. The image sensor of claim 12, wherein the first electrode and the insulation layer have a refractive index difference of greater than or equal to about 0.05.

14. The image sensor of claim 7, further comprising:
a color filter layer on one side of the semiconductor substrate, the color filter layer including,
a first color filter configured to selectively absorb light in the first wavelength region, and a second color filter configured to selectively absorb light in the second wavelength region.

15. The image sensor of claim 7, wherein
the first wavelength region is a blue wavelength region,
the second wavelength region is a red wavelength region, and
the third wavelength region is a green wavelength region.

16. An electronic device comprising:
an image sensor including,
a semiconductor substrate integrated with a first photoelectronic device configured to sense light in a first wavelength region and a second photoelectronic device configured to sense light in a second wavelength region; and
an organic photoelectronic device on the semiconductor substrate, the organic photoelectronic device configured to selectively absorb light in a third wavelength region and including,
 a first electrode and a second electrode facing each other, the first electrode including a plurality of nanopatterns arranged at a regular interval, and
 an active layer between the first electrode and the second electrode, the active layer configured to selectively absorb light in the third wavelength region.

* * * * *